US006352899B1

United States Patent
Sakiyama et al.

(10) Patent No.: US 6,352,899 B1
(45) Date of Patent: Mar. 5, 2002

(54) RAISED SILICIDE SOURCE/DRAIN MOS TRANSISTORS HAVING ENLARGED SOURCE/DRAIN CONTACT REGIONS AND METHOD

(75) Inventors: Keizo Sakiyama, Kashihara (JP); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/497,626

(22) Filed: Feb. 3, 2000

(51) Int. Cl.[7] .............................................. H01L 21/336
(52) U.S. Cl. ...................... 438/300; 438/596; 438/633; 438/683
(58) Field of Search ................................ 438/300, 304, 438/595, 596, 633, 634, 683

(56) References Cited

U.S. PATENT DOCUMENTS

| | | | |
|---|---|---|---|
| 4,471,522 A | 9/1984 | Jambotkar | 29/571 |
| 5,376,578 A | 12/1994 | Hsu et al. | 437/56 |
| 5,491,099 A | 2/1996 | Hsu | 437/35 |
| 5,516,710 A | 5/1996 | Boyd et al. | 437/31 |
| 5,683,924 A | * 11/1997 | Chan et al. | 438/300 |
| 5,773,358 A | * 6/1998 | Wu et al. | 438/300 |
| 5,828,103 A | 10/1998 | Hsu | 257/344 |
| 5,830,775 A | 11/1998 | Maa et al. | 437/41 |
| 5,866,459 A | 2/1999 | Naem et al. | 438/300 |
| 5,915,183 A | 6/1999 | Gambino et al. | 438/300 |
| 5,918,132 A | 6/1999 | Qian et al. | 438/299 |

* cited by examiner

Primary Examiner—Chandra Chaudhari
(74) Attorney, Agent, or Firm—Matthew D. Rabdau; David C. Ripma; Scott C. Krieger

(57) ABSTRACT

A method is provided for forming silicided source/drain electrodes in active devices in which the electrodes have very thin junction regions. In the process, adjacent active areas are separated by isolation regions, typically by LOCOS isolation, trench isolation or SOI/SIMOX isolation. A contact material, preferably silicide, is deposited over the wafer and the underling structures, including gate and interconnect electrodes. The silicide is then planed away using CMP, or another suitable planing process, to a height approximate the height of the highest structure. The silicide is then electrically isolated from the electrodes, using an etch back process, or other suitable process, to lower the silicide to a height below the height of the gate or interconnect electrode. The wafer is then patterned and etched to remove unwanted silicide. The remaining silicide typically forms silicided source regions and silicided drain regions that extend over a portion of the adjacent isolation regions such that the silicided source/drain regions are larger than the underlying source/drain regions to provide a larger contact area.

21 Claims, 6 Drawing Sheets

RAISED SILICIDE SOURCE/DRAIN MOS TRANSISTORS HAVING ENLARGED SOURCE/DRAIN CONTACT REGIONS AND METHOD

BACKGROUND OF THE INVENTION

This invention relates generally to semiconductor technology and more particularly to the method of forming silicide electrodes in active semiconductor devices, such as MOS transistors.

An important subject of ongoing research in the semiconductor industry is the reduction in the dimensions of devices used in integrated circuits. Planar transistors such as metal oxide semiconductor (MOS) transistors are particularly suited to use in high density integrated circuits. As the size of MOS transistors and other active devices decreases, the dimensions of the source, drain, and gate electrodes and the channel region of each device decreases correspondingly.

The design of ever smaller planar transistors with short channel lengths makes it necessary to provide very shallow source/drain junction regions. Shallow junctions are necessary to avoid lateral diffusion of implantation dopants into the channel during annealing and other process steps. Lateral diffusion is undesirable because it contributes to higher leakage currents and poor breakdown performance. Shallow source/drain regions, for example less than 1000 Å, and preferably less than 500 Å, are necessary for acceptable performance in short-channel devices.

When shallow-junction electrodes are used in transistors it becomes more difficult to provide reliable, low-resistance connections to the source/drain regions of the device. Metal-silicide contacts are a typical means of effecting such connections to source/drain electrodes. In the prior art, conductive metal is deposited on the silicon electrodes and annealed to form a metal-silicon compound on the surface of the electrodes. The compound, called silicide, is electrically and physically bonded to the electrode and has a substantially lower sheet resistance than the doped silicon on which it is formed. An important advantage of silicide contacts formed in this manner on small devices is that silicide is only formed where the deposited metal is in contact with silicon. By means of a selective etch, the metal is readily removed from the non-silicided area. Thus, the silicide regions are automatically aligned over only the electrode surfaces where underlying silicon is exposed on the source/drain regions. This self-aligned silicide process is generally referred to as the "salicide" process.

Unfortunately, the salicide process consumes a portion of the surface silicon that forms the underlying source/drain. This is because the metal-silicide is formed by a chemical reaction that occurs during an annealing step, when the deposited metal reacts with the underlying silicon. Electrodes with very thin junction depths have less silicon to sacrifice to the formation of silicide and can only permit a very thin layer of silicide to be formed. But thin silicide films are known to be thermally unstable and have an undesirably high sheet resistance. In the case of extremely thin junction depths, less than 500 Å, the sacrifice of silicon from the underlying junction will also significantly degrade junction performance.

It would be advantageous if an improved silicide process for ultra-thin junctions were available.

It would also be advantageous if the silicide layer provided a larger area to allow for subsequent contacts to be formed over the source/drain region.

SUMMARY OF THE INVENTION

Accordingly, a method is provided for forming MOS transistor structures on a silicon substrate. The method comprises defining a plurality of active areas on the substrate by forming one or more isolation regions to electrically isolate adjacent active areas from one another. Source and drain regions are formed in each active area. Electrode structures having electrodes and sidewalls are also formed on the substrate. The electrode structures can be either gate electrode structures, in which the electrode overlies a gate insulating layer, or interconnecting electrodes for connecting to active areas.

After forming the above structures, a contact material is deposited over the substrate and electrode structures. The contact material is preferably a deposited silicide. However, the contact material could initially be polycrystalline silicon.

The contact material is planed until level to remove excess contact material. The contact material is then electrically isolated from the electrodes. The electrical isolation can be accomplished by a selective etch back process, or continued planing to a predetermined level.

One preferred method comprises defining active areas on the substrate by forming one or more active area isolation regions to isolate adjacent active areas from each other. Source and drain regions are formed in each active area. Electrode structures are formed on the substrate, including a gate electrode structure in each active area, and interconnect electrode structures. The electrode structures preferably include electrode caps. Silicide is deposited over the entire wafer until it reaches a thickness at least equal to the height of the highest structure. The silicide is then planed until level. The silicide is then selectively etched with an etchant that etches the silicide faster than the electrode caps. The selective etch continues until the silicide reaches a level no higher than the top of the lowest electrode.

The method is suitable for forming silicided electrodes on a semiconductor substrate where devices such as MOS transistors are formed. The MOS transistor structure comprises a plurality of active areas formed on the substrate and isolated from adjacent active areas by isolation regions. A source region and a drain region are typically within an active area on opposite sides of a gate electrode. A source silicide region covers the source region and extends at least partially over the adjacent isolation regions. Likewise, a drain silicide region covers the drain region and extends partially over the adjacent isolation regions. By extending over the isolation regions, the silicide regions provide larger areas for subsequent electrical contact. The ability to provide larger areas by extending the silicide regions over the adjacent isolation regions also allows the source/drain regions to be made even smaller while maintaining sufficient area for electrical contact. Smaller source/drain regions in turn have lower capacitance and lower leakage currents.

The silicide material deposited to form the MOS transistor structures is preferably a combination of silicon and one or more metals selected from the group consisting of refractory and noble metals. Suitable examples of silicide materials used with the present invention include, but are not limited to, $TiSi_2$, $TaSi_2$, $WSi_2$, $CoSi_2$, NiSi or a combination thereof The silicide material is preferably deposited to a thickness of between approximately 2000 Å and 5000 Å over the entire area of the substrate using a chemical vapor deposition (CVD) process.

The step of planing the silicide is preferably carried out using a chemical mechanical polish (CMP) process. The CMP process preferably stops at the level of the highest electrode structure. The silicide is then selectively etched to allow for subsequent exposure of the gate electrodes. Preferably, the silicide will be etched until it is no higher than the lowest gate electrode. The etchant must be selective such that the silicide is etched faster than the electrode cap, so that a sufficient portion of every electrode remains to allow for subsequent contact upon completion of the etching process. Once the silicide has been etched to its desired height, the device can be masked to protect the areas where silicide is desired. The silicide can then be patterned, such that the remaining, unwanted, silicide can then be etched. This will typically leave silicide over the source region and the drain region. Preferably, the silicide will extend over the isolation regions to form larger source/drain contact regions. Subsequently, standard processes can be employed to complete formation of the desired device.

Although silicide is preferred, it would also be possible to initially deposit polycrystalline silicon, perform the planing, isolating, patterning, and etching steps described for deposited silicide, and subsequently depositing a silicidation material, and anneal to form a polycide.

DETAILED DESCRIPTION OF THE INVENTION

Figure 1:
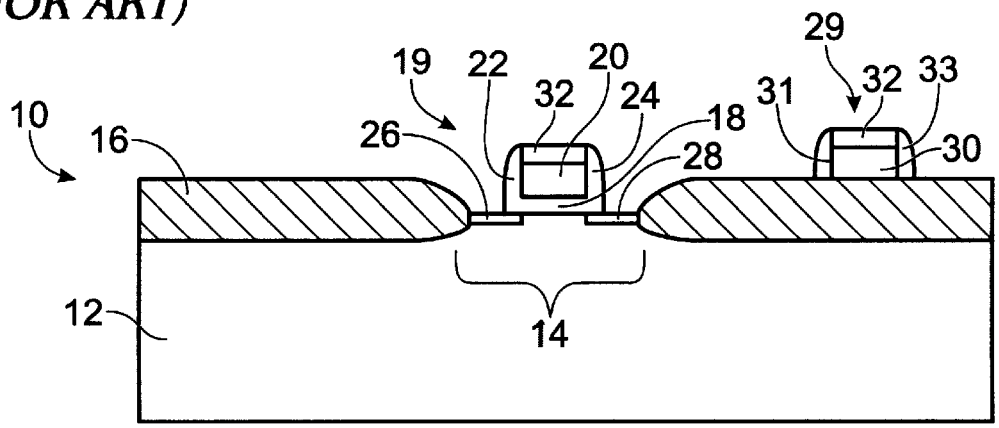
FIG. 1 is a schematic cross-sectional view showing the results of preliminary steps in the formation of MOS transistor structures on a LOCOS isolated substrate (prior art).

FIG. 1 (prior art) shows the result of several well known preliminary steps in the formation of metal oxide semiconductor (MOS) transistor structures 10 on a silicon substrate 12. The processing of silicon substrate 12 includes isolating an active area 14 by bounding it with one or more isolation regions 16. One preferred structure for forming the isolation regions is a local-oxidation of silicon (LOCOS) structure.

Further processing provides a gate electrode structure 19. The gate electrode structure 19, typically includes a gate insulating layer 18 overlying silicon substrate 12. A gate electrode 20 overlies gate insulating layer 18. A first sidewall 22 and a second sidewall 24 are provided for isolation on either side of gate electrode 20.

A source region 26 and a drain region 28 are formed by the implantation of doping impurities, either n+ or p+, as is well known in the art. Lightly doped drain/source (LDD) regions (not shown) may also be formed prior to, or in conjunction with, formation of source region 26 and drain region 28. Although the various figures show a n-channel device, MOS transistor structure 10 may be either a n-channel or p-channel device.

In addition to the structure in the active area 14, a representative interconnecting electrode structure 29 is formed on isolation regions 16 to provide connections to other active areas on the substrate (not shown). Interconnecting electrode structure 29 is intended to illustrate conductive interconnect lines and similar structures that, for example, could connect to, and be part of, a gate structure of an adjacent transistor (not shown). Interconnecting electrode structure 29 is formed in a manner similar to gate electrode structure 19, including an interconnecting electrode 30, first sidewall 31 and second sidewall 33.

Figure 2:
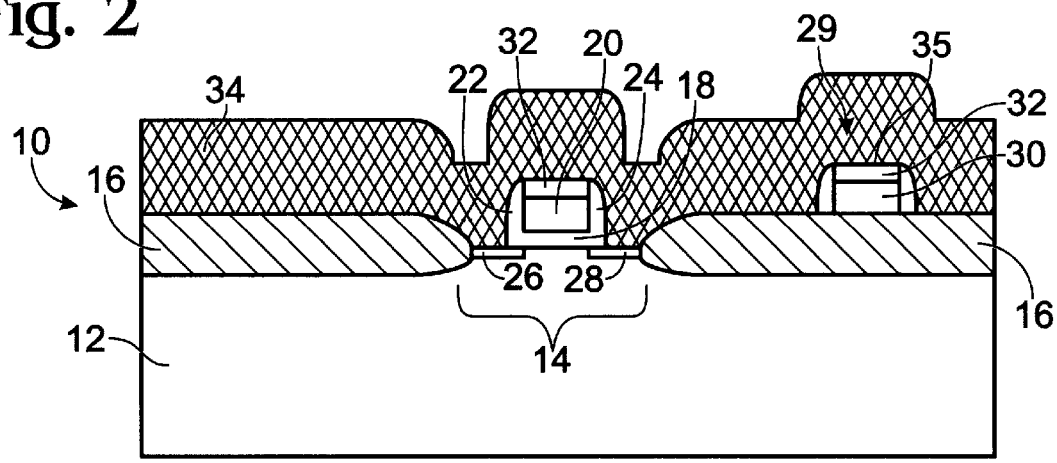
FIG. 2 is a schematic cross-sectional view as in FIG. 1 illustrating the results of depositing contact material over the substrate and transistor structures.
Figure 3:
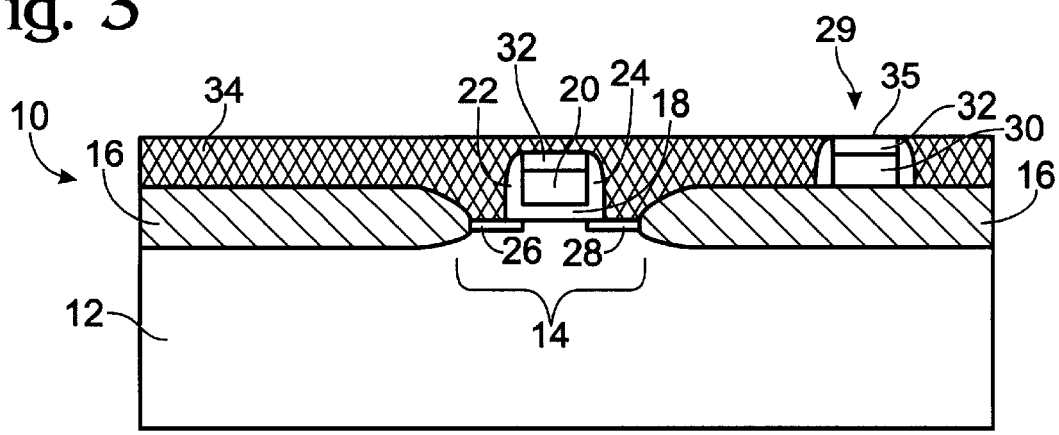
FIG. 3 is a schematic cross-sectional view as in FIG. 2 illustrating the results of planing the contact material.

Both gate electrode structure 19 and interconnecting electrode structure 29 may be referred to generally as electrode structures. Likewise, gate electrode 20 and interconnecting electrode 30 may be referred to generally as electrodes. Electrode structures 19 and 29 as shown in FIGS. 1–3 include electrode caps 32 over electrodes 20 and 30. Electrode caps 32 are formed by depositing silicon dioxide, also known as oxide, or silicon nitride, photolithographic patterning and etching. Electrode caps 32 are present to protect underlying gate electrode 20 and interconnecting electrode 30 during subsequent processing. Although electrode caps 32 are preferable, especially in connection with LOCOS isolated structures, they are not required in all cases, as will be described below.

Referring now to FIG. 2, a layer of contact material 34 is deposited. The deposited contact material is preferably a refractory metal silicon compound, also known as silicide, formed by combining silicon and one or more metals selected from the group consisting of refractory and noble metals. Suitable examples of silicide materials used with the present invention include, $TiSi_2$, $TaSi_2$, $WSi_2$, $CoSi_2$, $NiSi$, or a combination thereof. For ease of processing, contact material 34 is deposited over the entire wafer. It would, however, also be possible to apply contact material over only selected portions of the wafer. Contact material 34 is deposited to a thickness at least equal to the height of the highest electrode structure above silicon substrate 12. In FIG. 2 interconnecting electrode structure 29 has a top 35 that is the highest electrode structure, because it is further from the surface of the substrate than any other structure. Although for illustration purposes reference is made to the height or relative position of structures to the substrate, in operation the substrate and structures could be in any orientation. For a LOCOS structure, as shown, the thickness is at least equal to the sum of thicknesses of gate insulating layer 18, gate electrode 20 and electrode cap 32 over the source/drain regions. Contact material 34 is deposited by any known method, including non-selective chemical vapor deposition (CVD).

FIG. 3 shows MOS transistor structure 10 following leveling, also referred to herein as "planing", of contact material 34. Contact material 34 can be leveled using any appropriate planarization or etching process, including chemical mechanical polish (CMP) techniques. Preferably, contact material 34 will be planarized using CMP until it is substantially level with the highest of the structures on silicon substrate 12, which as illustrated in FIG. 3 is top 35 of interconnecting electrode structure 29. Depending on the device design, other structures may be higher, although typically it will be either a gate electrode structure or an interconnecting electrode structure.

Figure 4:
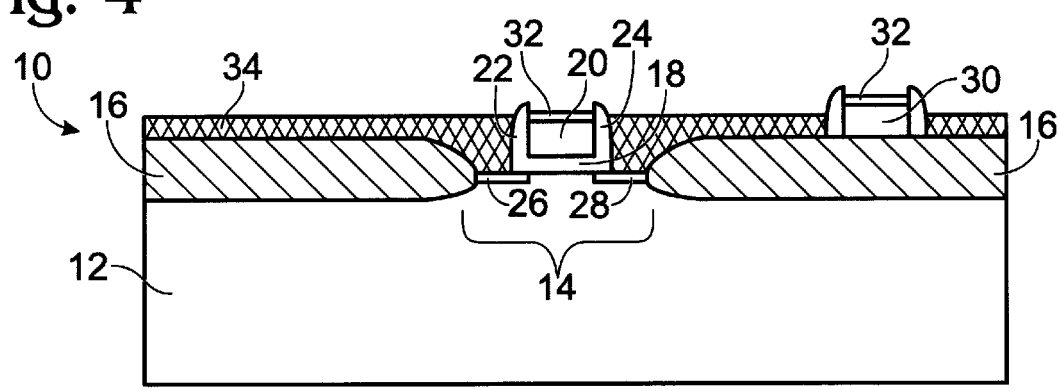
FIG. 4 is a schematic cross-sectional view as in FIG. 3 illustrating the results of etching the contact material.

To provide for proper electrical performance of MOS transistor structure 10, electrodes 20 and 30 should be electrically isolated from contact material 34. A preferred method of electrically isolating the electrodes from the contact material is to etch the contact material back to a level no higher than the lowest electrode, whether a gate electrode or an interconnect electrode. This process is sometimes referred to herein as "etch back." An etchant is used on the substrate and will typically etch the surfaces of all materials, but at different rates for different materials. The preferred method of etching contact material 34 is to use an etchant that has a selectivity of contact material to electrode cap material sufficient to etch back contact material 34 while allowing a sufficient portion of all gate electrodes 20 and interconnecting electrodes 30 to remain. Preferably, contact material 34 will be etched back to a level such that a small portion of electrode caps 32 will remain. In the case of the LOCOS isolated structure shown in FIG. 4, the selectivity is preferably sufficient to remove a thickness of contact material 34 at least equal to the sum of the thickness of one of the electrode caps 32 and the height of isolation regions 16 above silicon substrate 12, without completely removing any of the electrode caps 32. As a result, contact material 34 is no higher than the top of gate electrode 20. The minimum selectivity ratio, which is the ratio of the etch rate of contact material to the etch rate of electrode caps 32, i.e. the etch rate of silicide to oxide or silicon nitride, is at least one in this embodiment, but preferably five or greater.

Figure 5:
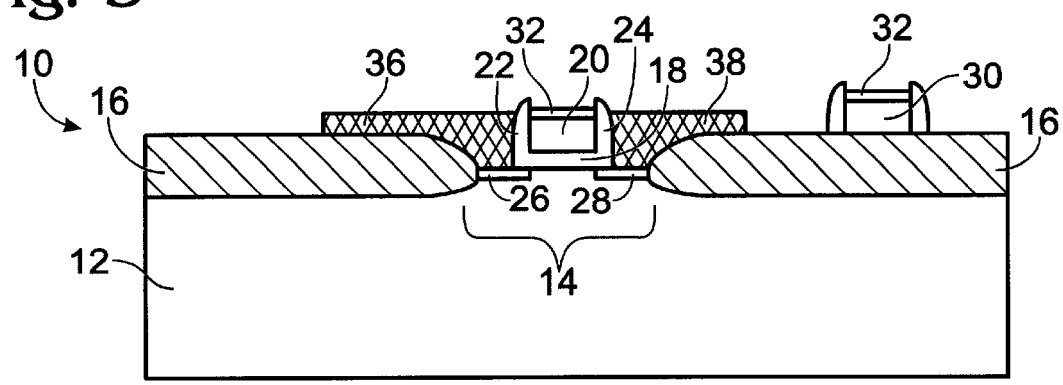
FIG. 5 is a schematic cross-sectional view as in FIG. 4 illustrating the results of selectively removing the contact material from unwanted regions.

Once contact material 34 has been planarized and etched back, contact material 34 remains substantially covering the entire wafer. Contact material 34 should then be removed from selected areas, in part, to allow for electrical isolation of adjacent structures, such as individual active devices. A suitable method of removing contact material 34 from selected areas is to apply photoresist to silicon substrate 12, as is well known in art. The photoresist is patterned to protect areas of contact material 34 that should remain following further processing. The unwanted contact material is then selectively etched to remove it. The remaining photoresist is then stripped, leaving only desired portions covered with contact material 34 as shown in FIGS. 5 and 6.

Figure 6:
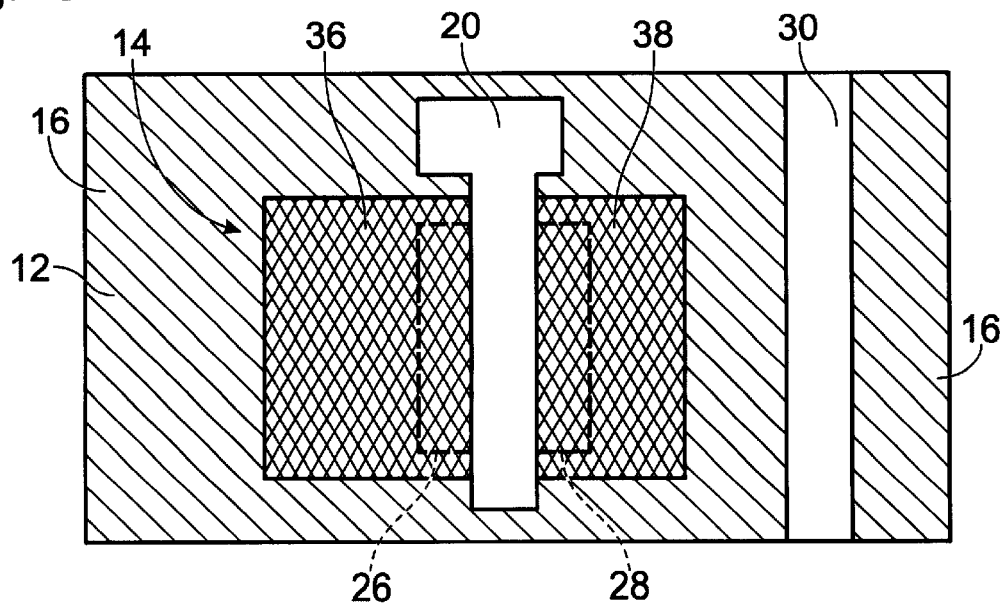
FIG. 6 is a top view of the substrate and transistor structures in FIG. 5 showing the contact material extending partially over the isolation regions adjacent the source and drain regions, as well as a gate electrode structure and an interconnect electrode structure.

As shown in FIG. 6, the remaining contact material 34 preferably covers source region 26 and drain region 28 and extends over isolation regions 16 adjacent to each, forming source contact region 36 and drain contact region 38. By maintaining a portion of contact material 34 partially over isolation regions 16, larger contact areas may be provided for both source region 26 and drain region 28, during subsequent processing steps.

Figure 7:
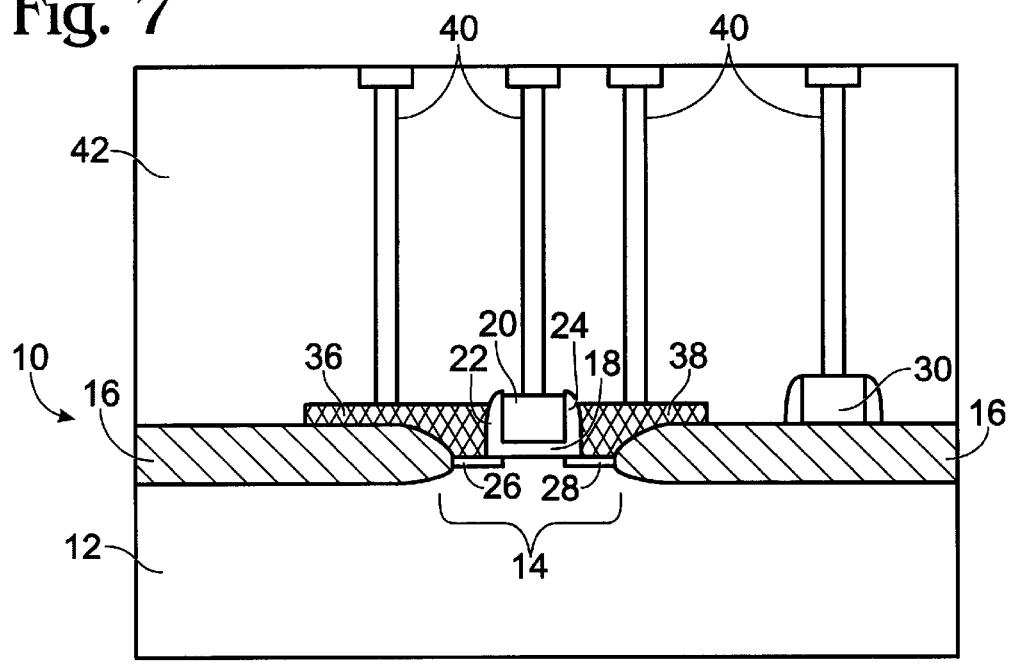
FIG. 7 is a schematic cross-sectional view following subsequent processing to provide a passivation layer and electrical contacts.

FIG. 7 shows a cross-sectional view of a completed device, with electrical contacts 40 extending through a passivation layer 42 to contact source contact region 36, drain contact region 38, gate electrode 20, and interconnecting electrode 30.

Figure 8:
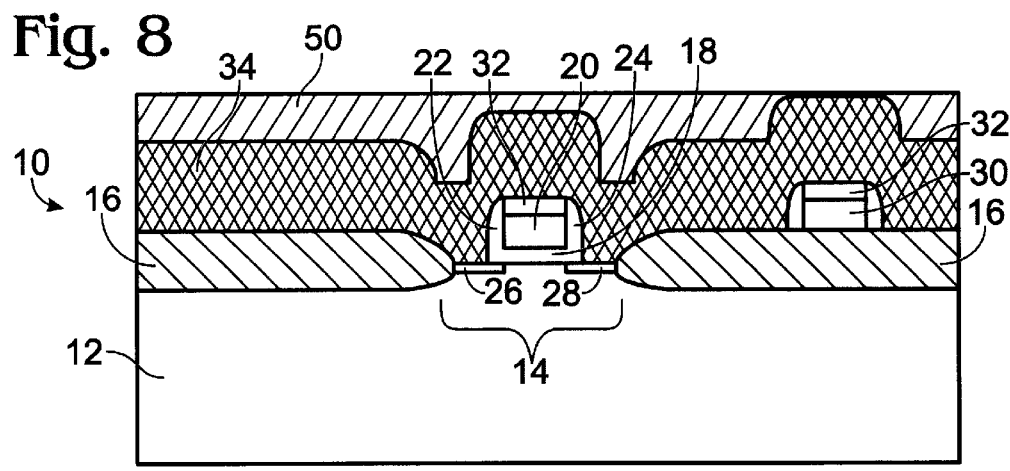
FIG. 8 is a schematic cross-sectional view illustrating an alternative method of planing using spin-on glass.

FIG. 8 shows an alternative method for leveling contact material 34. The step illustrated by FIG. 8 would occur between the steps described above with respect to FIGS. 2 and 3. A layer of glass 50 is spin coated over contact material 34. The glass fills in the troughs left by the contact material. The surface can then be etched such that the glass and the contact material are brought to a level approximating the level of the highest structure, similar to the results shown in FIG. 3. An etchant with an etch ratio of glass to contact material as close to one as possible should be used for this step. Since, an etchant with a glass to contact material etch ratio of exactly one is not known to applicants, the resulting surface using this alternative method will not be as level or uniform as the preferred CMP planarization method discussed previously. The resulting surface will instead be wavy and uneven. Although not ideal, this surface is still adequate for further processing according to the present invention. For the purposes of this invention applying glass and subsequently etching the glass and contact material is considered a planing process, even though a smooth plane may not be produced. Likewise, the term level does not require a perfectly flat or smooth plane, level refers to the elimination of the contact material above a desired height. The remaining steps of the present invention are as shown in FIGS. 4, 5, 6, and 7, as well as FIGS. 10, 13, 14, 15 and 16 described below.

Although the above description relates to LOCOS isolated structures, the method of the present invention can be performed on devices fabricated with a variety of isolation structures, including, trench isolated bulk silicon devices, mesa structures using silicon on insulator (SOI) structures or separation by implanted oxygen (SIMOX) structures.

For other isolation structures, such as trench isolated, or SOI/SIMOX mesa devices, which have less variation in the height of electrode structures, the electrical isolation may be obtained by etching back the contact material with an etchant that has a lower contact material to electrode cap etch ratio than in the first embodiment of FIGS. 1–7. In some cases, the contact material may only need to be etched an amount slightly greater than the thickness of the electrode caps. The selectivity ratio, which is the ratio of the etch rate of electrode cap versus contact material, may be approximately one or greater in cases where there is only slight variation in the height of electrode structures.

Figure 9:
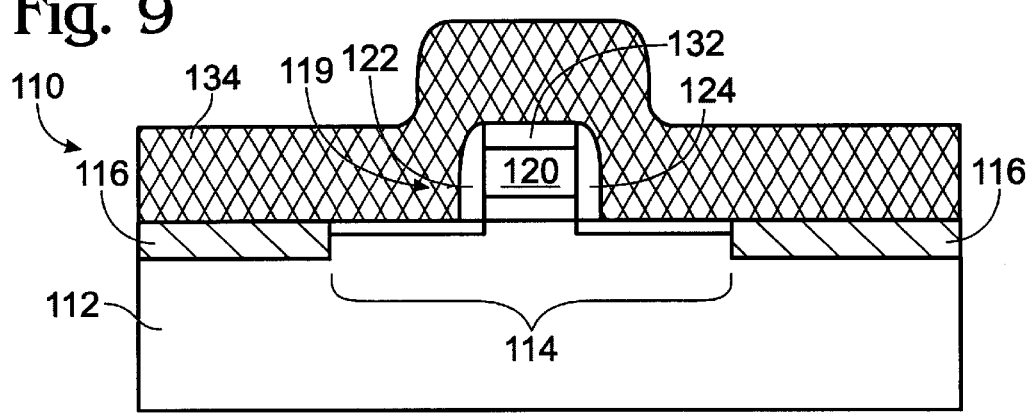
FIG. 9 is a schematic cross-sectional view, similar to FIG. 2, illustrating the application of an alternative embodiment of the present invention to a trench isolated structure.
Figure 10:
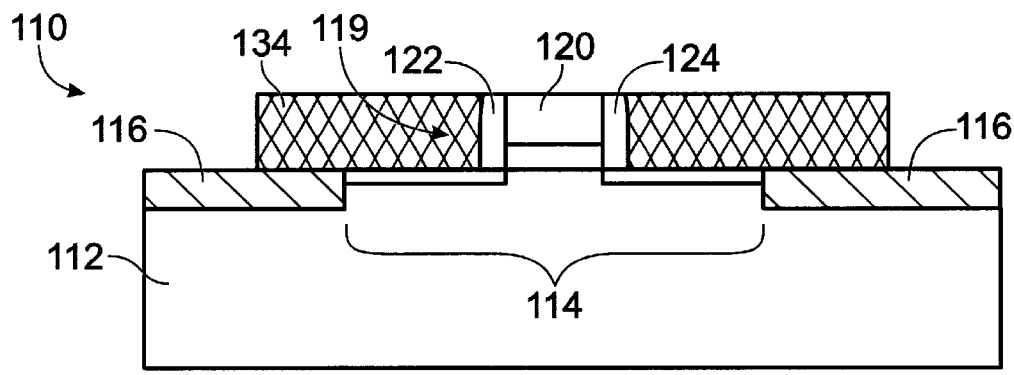
FIG. 10 is a schematic cross-sectional view, similar to FIG. 5, illustrating the result of continuing the planing process to provide electrical isolation followed by selective patterning and etching.

When various structures, including electrode structures, are formed such that they have similar heights above the substrate, such as on trench isolated, or SOI/SIMOX isolated structures, electrical isolation between electrodes and contact material may be provided by continuing the planing process below the original height of the electrode structures. An alternative embodiment of processing in accordance with the present invention is shown in FIGS. 9–10. A MOS transistor structure 110 has been formed on a substrate 112 having an active area 114 bounded by trench isolation regions 116. FIG. 9, is analogous to FIG. 2 and shows an electrode structure 119 covered by a deposited contact material 134. The electrode structure 119 has tapered sidewalls 122 and 124 on either side of an electrode 120. The tapered sidewall 122 and 124 get thicker towards the substrate. As the planning process continues the sidewalls are planed away along with the contact material, until a level is reached at which the sidewalls are thick enough to provide adequate electrical isolation between the electrode and the contact material. Accordingly, the contact material does not need to deposited to a height equal to the height of the electrode structure, but rather only to a height equal to or greater than the height at which the planing process is to be stopped. It should be noted that although an electrode cap 132 is shown, it is not necessary to the invention since the planing process in this embodiment of the invention removes electrode cap 132.

FIG. 10 is analogous to FIG. 5, showing the results of planing the contact material, electrically isolating electrode 120 from contract material 134 by continued planing of electrode structures 119 and contact material 134, and subsequently selectively etching away a portion of the remaining contact material 134 to form a source contact region 136 and a drain contact region 138.

Figure 11:
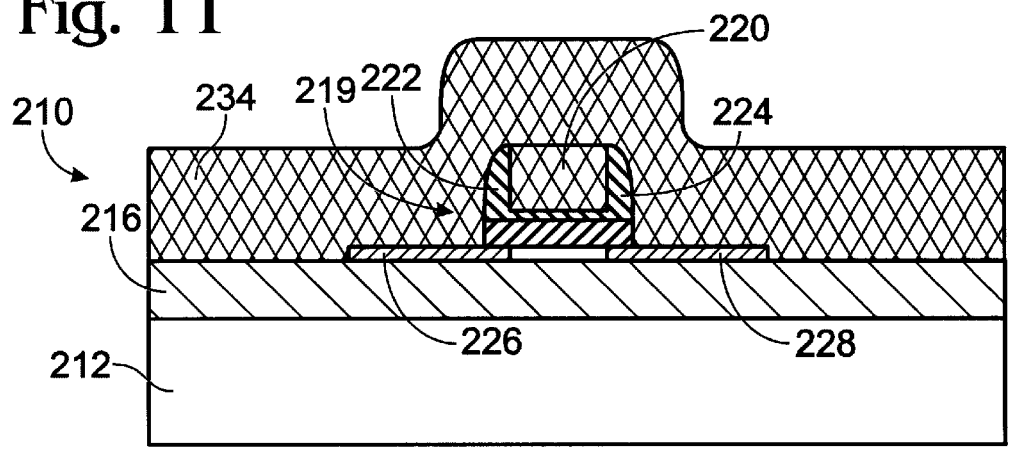
FIG. 11 is a schematic cross-sectional view, similar to FIG. 2, illustrating the application of an alternative embodiment of the present invention to a SOI/SIMOX isolated structure without an electrode cap.
Figure 12:
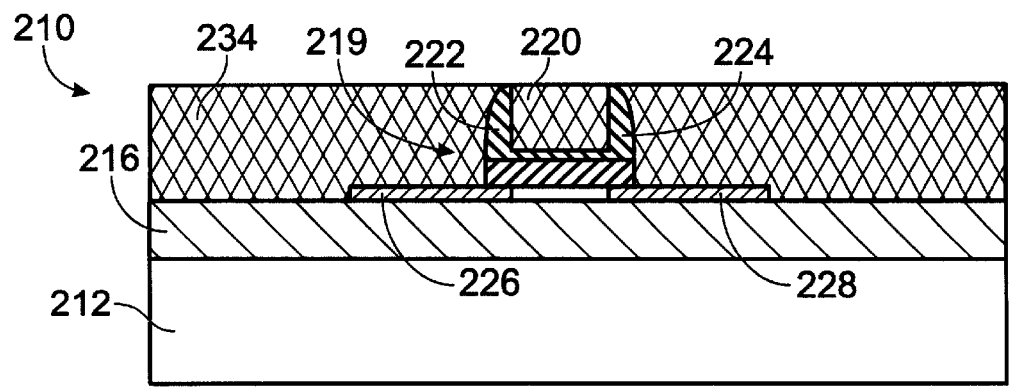
FIG. 12 is a schematic cross-sectional view, similar to FIG. 4, illustrating the result of planing the contact material.

Referring now to FIG. 11, MOS transistor structure 210 are formed on a SOI/SIMOX isolated structure having an isolation layer 216 overlying a silicon substrate 212. A source region 226 and a drain region 228 are formed within an active area 214 formed by depositing a layer of silicon over isolation layer 216 and doping the desired areas as is well known in the art. For the purposes of this invention, a SOI/SIMOX isolated structure and a trench isolated structure are generally interchangeable since the electrode structures are at approximately the same height. An electrode structure 219 is shown, having sidewalls 222 and 224 on either side of an electrode 220, but without an electrode cap. As depicted in FIGS. 11–16 electrode 220 is a gate electrode. Contact material 234 has been deposited to a thickness at least equal to the height of electrode structure 219 above isolation layer 216. Contact material 234 is then planed until level, using CMP or other planing methodology disclosed herein, preferably stopping at the top of electrode structure 219 as shown in FIG. 12.

Figure 13:
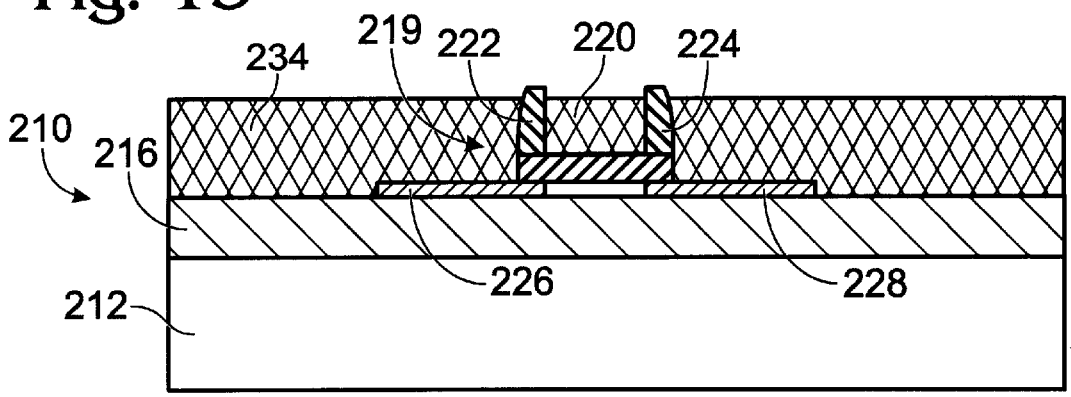
FIG. 13 is a schematic cross-sectional view illustrating the result of etching the contact material and electrode to provide electrical isolation.

After planing, electrode 220 and contact material 234 are electrically isolated by selectively etching using an etchant with a contact material to sidewall etch ratio of at least one. Although contact material 234 could be deposited silicide, as described above, here for illustration purposes contact material 234 and electrode 220 are both polycrystalline silicon, or poly. The other embodiments described above could also use polycrystalline silicon provided that the silicidation process described below is performed. Since electrode 220 and contact material 234 are the same material, poly, the etch ratio will be equal to one. However, the etch ratio of the contact material to the sidewalls should be greater than one. The etch should continue until the height of contact material 234 is low enough that sidewalls 222 and 224 are able to provide electrical isolation. Electrical isolation is provided by the height of the sidewalls above the contact material, as shown in FIG. 13. Since the etching process will also etch sidewalls 222 and 224 as well as contact material 234, FIG. 13 shows the sidewalls 222 and 224 with the upper portion removed for illustration purposes. Alternatively, electrical isolation is provided by the thickness of sidewalls 222 and 224 at the level of contact material 234, similar to the configuration shown in FIG. 10.

Figure 14:
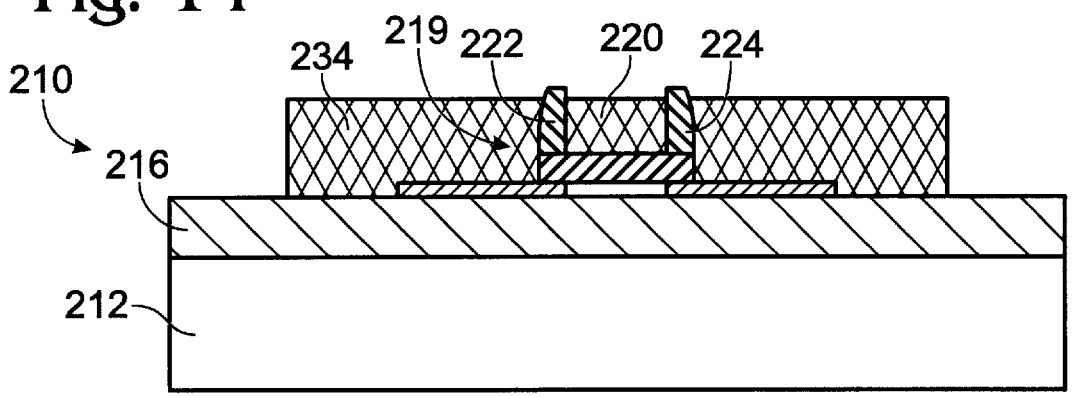
FIG. 14 is a schematic cross-sectional view, similar to FIG. 5, illustrating the result of etching the contact material and electrode to provide electrical isolation followed by selective patterning and etching.

Once contact material 234 has been planarized and etched back, contact material 234 remains, potentially covering the entire substrate. Contact material 234 should typically be removed from selected areas, in part, to allow for continued electrical isolation of adjacent structures. A photoresist can be applied to the silicon substrate and patterned, as is well known in the art. The unwanted contact material can then be selectively etched to remove it. The remaining photoresist can then be stripped, leaving only desired portions covered with contact material as shown in FIG. 14. Preferably, the remaining contact material 234 covers source region 226, drain region 228 and extends over isolation region 216 adjacent to each forming a source contact region 236 and a drain contact region 238. By maintaining a portion of contact material 234 over isolation region 216, larger contact areas are provided, allowing for smaller source/drain to be used while still providing adequate area for electrical contact. Smaller source/drain regions have lower capacitances, and lower leakage currents.

Figure 15:
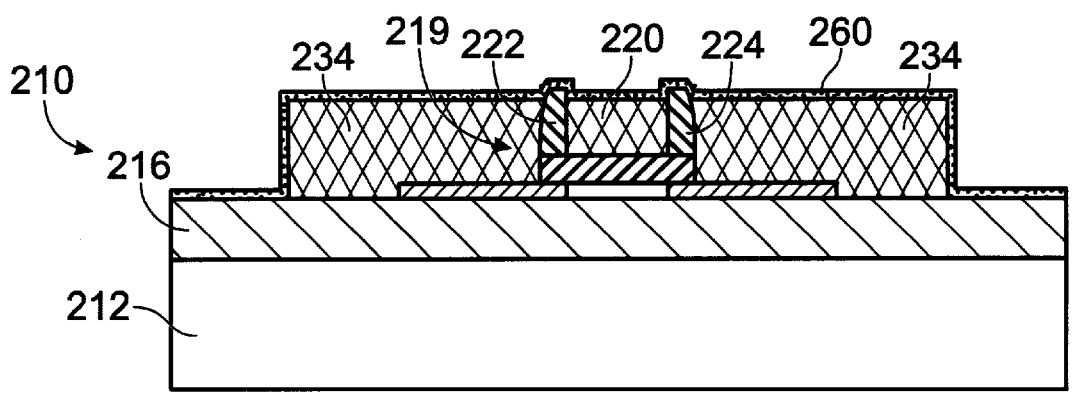
FIG. 15 is a schematic cross-sectional view illustrating the deposition of silicidation material over polycrystalline silicon contact material.

If the contact material is polycrystalline silicon, an additional silicidation process is typically needed to provide good electrical contact. As shown in FIG. 15, a layer of silicidation material 260 is deposited over areas covered by contact material 234. Generally for ease of process, the silicidation material is deposited over the entire substrate. The silicidation material is selected from refractory metals and noble metals, including Co, Ti, Ni, W, Pt, Pd, No, Ta or a combination thereof The next step is rapid thermal annealing. The substrate is annealed in a suitable annealing chamber at a temperature and for a duration sufficient to react the silicidation material with the underlying polycrystalline silicon material underneath to form a silicide layer 270. The temperatures and times are known by those skilled in the art. Where the silicidation material does not overly silicon, no silicidation occurs.

Figure 16:
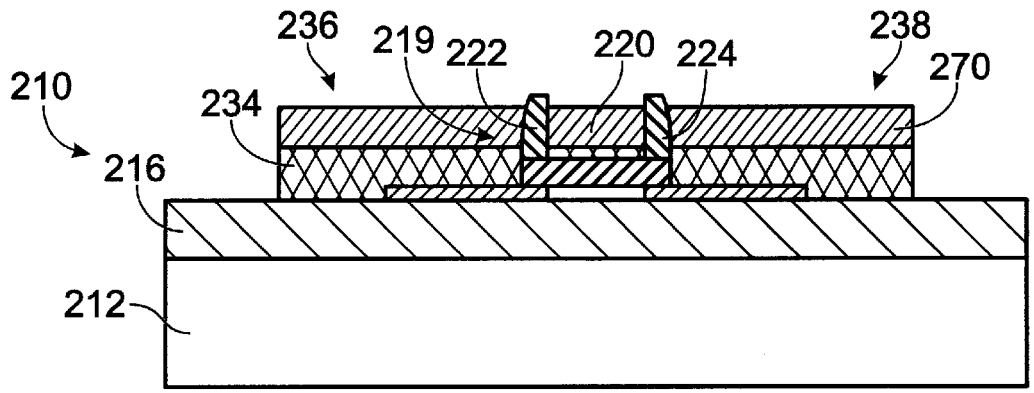
FIG. 16 is a schematic cross-sectional view, similar to FIG. 5, illustrating the result of rapid thermal annealing to convert a polycrystalline silicon contact material into silicide.

Once the silicide lay 270 is formed, the remaining silicidation material is removed. The silicide layer 270 remains over the contact material 234, which is polycrystalline silicon. The combination of a layer of silicide over an underlying layer of polycrystalline silicon is referred to as a polycide. Polycide forms source contact region 236, drain contact region 238 and electrode 220. Although, electrode 220 as shown is a gate electrode, the same process would apply to interconnecting electrodes (not shown). FIG. 16 shows the resulting structure following the silicidation process.

Figure 17:
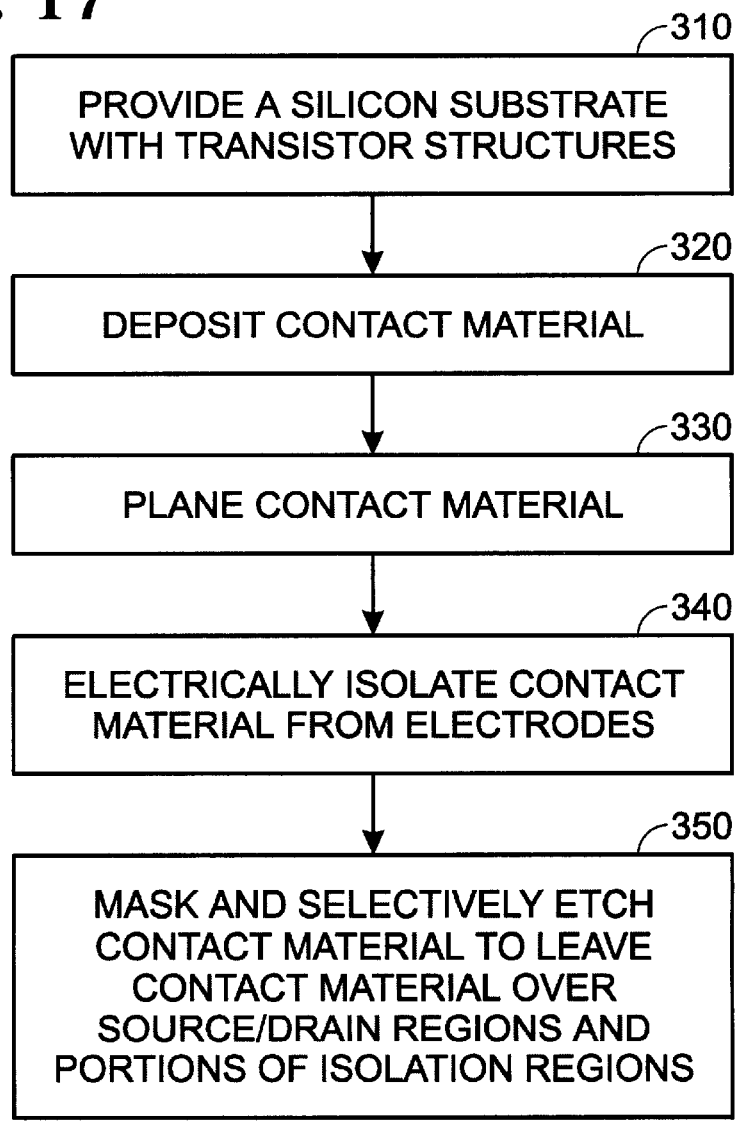
FIG. 17 is a flow chart summarizing the steps in the method of the present invention.

The steps in the method of the present invention are illustrated schematically in FIG. 17. The first step 310 is to provide a substrate with appropriate transistor structures.

Step 320 is depositing contact material over the substrate and structures. As described above the contact material can be a deposited silicide material, a polycrystalline silicon (subject to a subsequent silicidation process) or other appropriate material.

Step 330 is the planing of the deposited contact material and other structures, if necessary. The planing process is preferably accomplished using a CMP process, however, spin coating a layer of glass over the contact material and then etching the glass and contact material is also within the scope of the present invention.

Step 340 is the electrical isolation of the electrodes from the contact material. This step can be accomplished by etching, or continued planing, depending on the variation in height of the electrode structures.

Step 350 is the patterning and final etch step to remove contact material to allow for isolation of adjacent structures or active areas. The patterning and final etch also leaves contact material over the source region and the drain region to form a source contact region and a drain contact region.

Alternative embodiments are possible within the scope of the present invention. As is clear from the illustrative examples, the invention can be practiced on a variety of substrate isolation structures, using different electrode structures, with or without electrode caps (depending on the variation in structure heights), using multiple planarization methods, and multiple methods of electrically isolating adjacent structures. Other variations of the method within the scope of the present invention will occur to those of ordinary skill in the art. Accordingly, the foregoing disclosure and description thereof are for illustrative purposes only and are not intended to limit the invention. This invention is defined by the claims.

What is claimed is:

1. A method of forming MOS transistor structures on a silicon substrate comprising the steps of:
   a) defining a plurality of active areas on the substrate by forming one or more active area isolation regions, whereby adjacent active areas are isolated from each other;
   b) in each active area, forming source and drain regions;
   c) on the substrate, forming electrode structures comprising an electrode and insulating sidewalls;
   d) depositing contact material on the substrate and structures;
   e) planing the contact material;
   f) in each active area, electrically isolating the electrode from the deposited contact material; and
   g) patterning the contact material to form contact areas overlying source and drain regions and extending over active area isolation regions, whereby contact areas are formed having a larger area than the area of the underlying source and drain regions.

2. The method as in claim 1, wherein the sidewalls are tapered and thinner at the top, and the source region, the drain region, and the electrode are electrically isolated by continuing the planing process to a level at which the sidewalls are thick enough to provide electrical isolation.

3. The method as in claim 1, wherein the source region, the drain region, and the electrode are electrically isolated by selectively etching the contact material.

4. The method as in claim 3, wherein the contact material is selectively etched with an etchant that etches the contact material at least as fast as the sidewalls until the contact material is etched to a level at which the sidewalls are thick enough to provide electrical isolation.

5. The method as in claim 3, wherein the contact material is selectively etched with an etchant that etches the contact material faster than the sidewalls whereby a portion of the sidewalls extend higher than the contact material to provide electrical isolation.

6. The method as in claim 3, wherein the electrode structure further comprises electrode caps over the electrodes, and the contact material is selectively etched with an etchant that etches the contact material at least as fast as the electrode caps until the contact material reaches a level no higher than the lowest electrode.

7. The method as in claim 6, wherein the etching step has a contact material to electrode cap etch ratio of at least 1.

8. The method as in claim 6, wherein the isolation regions are formed by LOCOS isolated structure.

9. The method as in claim 8, wherein the etching step has a contact material to electrode cap etch ratio larger than 5.

10. The method as in claim 8, wherein the etching step has a contact material to electrode cap etch ratio sufficient to etch the contact material to a depth below the lowest electrode cap without completely etching away any electrode.

11. The method as in claim 10, further comprising depositing silicidation material over the contact material, wherein the contact material is polysilicon, following removal of selected areas of polysilicon, rapid thermal annealing to form silicide in regions covered by polysilicon, whereby a polycide is formed over the regions covered by polysilicon, and removing remaining silicidation material.

12. The method as in claim 11, wherein the silicidation material is at least one refractory metal.

13. The method as in claim 12, wherein the silicidation material is at least one refractory metal selected from the group consisting of Co, Ti, Ni, W, Pt, Pd, Mo and Ta.

14. The method as in claim 1, further comprising removing selected areas of the remaining contact material to provide source/drain contact regions in each active area.

15. The method as in claim 14, wherein the contact material is polysilicon.

16. The method as in claim 14, wherein each source/drain contact region extends over a portion of the adjacent isolation regions, whereby the area of each source/drain contact region is larger than the respective source/drain region to facilitate subsequent interconnections.

17. The method as in claim 1, wherein the contact material is applied over the entire substrate.

18. The method as in claim 1, the contact material is at least one refractory metal silicon compound.

19. The method as in claim 18, wherein the contact material is at least one refractory metal silicon compound chosen from the group consisting of $TiSi_2$, $TaSi_2$, $WSi_2$, $CoSi_2$ and $NiSi$.

20. The method as in claim 1, wherein the planing is accomplished by chemical mechanical polish.

21. A method of forming MOS transistor structures on a silicon substrate comprising the following steps:
   a) defining a plurality of active areas on the substrate by forming one or more active area isolation regions, whereby adjacent active areas are isolated from each other;
   b) in each active area, forming source and drain regions;
   c) forming electrodes on the substrate, including a gate electrode in each active area, and interconnect electrodes;
   d) forming insulating sidewalls along the gate electrode;
   e) forming silicon nitride electrode caps overlying the electrodes;
   f) depositing silicide over the entire substrate to a thickness sufficient to allow for subsequent planarization of the silicide layer;
   g) planing the silicide layer;
   h) selectively etching silicide to reduce silicide thickness to at least the level of the gate electrode without completely removing any electrode; and
   i) removing silicide from undesired areas to form silicide regions overlying source and drain regions and extending over an upper surface of adjacent isolation regions, whereby contact areas larger than the source and drain areas are formed.

* * * * *